United States Patent
Taylor

Patent Number: 5,941,936
Date of Patent: Aug. 24, 1999

[54] ONE-BIT RUN-LENGTH ENCODING AND PLAYBACK SYSTEM

[75] Inventor: Stephen Francis Taylor, Santa Monica, Calif.

[73] Assignee: Taylor Group of Companies, Inc., North Hollywood, Calif.

[21] Appl. No.: 08/961,316

[22] Filed: Oct. 30, 1997

Related U.S. Application Data

[60] Provisional application No. 60/030,253, Oct. 31, 1996.

[51] Int. Cl.[6] .................................................. G10L 3/00
[52] U.S. Cl. .......................................... 703/503; 703/212
[58] Field of Search .................................... 704/212, 200, 704/500, 501, 502, 503, 504, 229, 230; 381/17, 18

[56] References Cited

U.S. PATENT DOCUMENTS

| | | | |
|---|---|---|---|
| 5,052,685 | 10/1991 | Lowe et al. | 463/35 |
| 5,313,524 | 5/1994 | Van Hulle et al. | 381/105 |
| 5,440,638 | 8/1995 | Lowe et al. | 381/17 |
| 5,471,558 | 11/1995 | Tsutsui | 395/2.28 |
| 5,500,900 | 3/1996 | Chen et al. | 381/17 |
| 5,517,570 | 5/1996 | Taylor | 381/18 |
| 5,590,207 | 12/1996 | Taylor | 381/90 |
| 5,596,647 | 1/1997 | Wakai et al. | 381/77 |
| 5,689,570 | 11/1997 | Taylor | 381/18 |
| 5,737,720 | 4/1998 | Miyamori et al. | 704/229 |
| 5,740,306 | 4/1998 | Shinohara et al. | 386/67 |
| 5,745,584 | 4/1998 | Taylor | 381/332 |
| 5,764,698 | 6/1998 | Sudharsanan et al. | 375/241 |
| 5,793,432 | 8/1998 | Mishima et al. | 348/423 |
| 5,812,675 | 9/1998 | Taylor | 381/18 |

OTHER PUBLICATIONS

Circuits and System, 1998. ISCAS. Malvar, "Enhancing the performance of subband audio coders for spech signals" pp. 98–101 vol.. 5. May 1998.

Solid State Circuits Conference, 1995. Galbi et al., "An MPEG–1 audio/video decoder with run–length compressed antialiased video overlays". pp. 286–287. Feb. 1995.

Signals, Systems and Computers, 1993. Tewfik et al., "Enhanced wavelet based audio coder". Pp. 896–900 vol. 2. Nov. 1993.

IC Master, "SAA7366—Bitstream Conversion ADC for Digitals Audio Systems", Philips Semiconductors product brochure, Form 3974, 1996 (1 page).

*Primary Examiner*—Richemond Dorvil
*Attorney, Agent, or Firm*—Gates & Cooper

[57] ABSTRACT

The present invention provides a one-bit run-length encoder system that encrypts and compresses a digital audio, and one-bit run-length playback system.

16 Claims, 4 Drawing Sheets

ONE-BIT RUN-LENGTH ENCODING AND PLAYBACK SYSTEM

CROSS-REFERENCE TO RELATED PATENTS AND APPLICATIONS

This application claims the benefit under 35 U.S.C. § 1.119(e) of provisional application Ser. No. 60/030,253, entitled "ONE-BIT ENCODING AND PLAYBACK SYSTEM," filed on Oct. 31, 1996, by Stephen F. Taylor, which application is incorporated herein by reference.

This application is related to application Ser. No. 08/607,830, entitled "SOUND REPRODUCING ARRAY PROCESSOR SYSTEM," filed on Feb. 27, 1996, by Stephen F. Taylor, which is a divisional of U.S. Pat. No. 5,517,570, entitled "SOUND REPRODUCING ARRAY PROCESSOR SYSTEM," filed on Dec. 14, 1993, issued May 14, 1996, by Stephen F. Taylor, both of which are incorporated herein by reference.

This application is related to application Ser. No. 08/713,794, entitled "SOUND REPRODUCING ARRAY PROCESSOR SYSTEM," filed on Sep. 13, 1996, by Stephen F. Taylor, which is a continuation of U.S. Pat. No. 5,590,207, entitled "SOUND REPRODUCING ARRAY PROCESSOR SYSTEM," filed on May 17, 1994, issued on Dec. 31, 1996, by Stephen F. Taylor, which is a continuation-in-part of U.S. Pat. No. 5,517,570, entitled "SOUND REPRODUCING ARRAY PROCESSOR SYSTEM," filed on Dec. 14, 1993, issued May 14, 1996, by Stephen F. Taylor, all of which are incorporated herein by reference.

This application is related to application Ser. No. 08/631,705, entitled "SOUND REPRODUCING ARRAY PROCESSOR SYSTEM," filed on Apr. 9, 1996, by Stephen F. Taylor, which is a continuation-in-part of U.S. Pat. No. 5,590,207, entitled "SOUND REPRODUCING ARRAY PROCESSOR SYSTEM," filed on May 17, 1994, issued on Dec. 31, 1996, by Stephen F. Taylor, which is a continuation-in-part of U.S. Pat. No. 5,517,570, entitled "SOUND REPRODUCING ARRAY PROCESSOR SYSTEM," filed on Dec. 14, 1993, issued May 14, 1996, by Stephen F. Taylor, all of which are incorporated herein by reference.

BACKGROUND OF THE INVENTION

1. Field of the Invention.

This invention relates in general to audio recording and playback systems, and in particular to a one-bit encoding and playback system for sound reproducing arrays.

2. Description of Related Art.

Digital audio technology has become the standard in sound recording and playback methods. The present invention provides a low cost digital audio encoding and playback system that encrypts and compresses digital audio, but which avoids the typical pitfalls involved.

Typically, when multi-channel digital audio is compressed, problems arise due to quantization levels and sampling rates. One form of digital audio comprises "one-bit" digital audio output by CD players and the like. One-bit digital audio comprises a 2's complement form of pulse code modulated (PCM) audio signals. Generally, this type of digital audio does not lend itself to compression. However, the present invention transforms and optimizes the digital audio so that it is more amenable to compression.

SUMMARY OF THE INVENTION

To overcome the limitations in the references described above, and to overcome other limitations that will become apparent upon reading and understanding the present specification, the present invention discloses a one-bit run-length encoder system and one-bit run-length playback system.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

One-Bit Run-Length Encoding System

Figure 1:
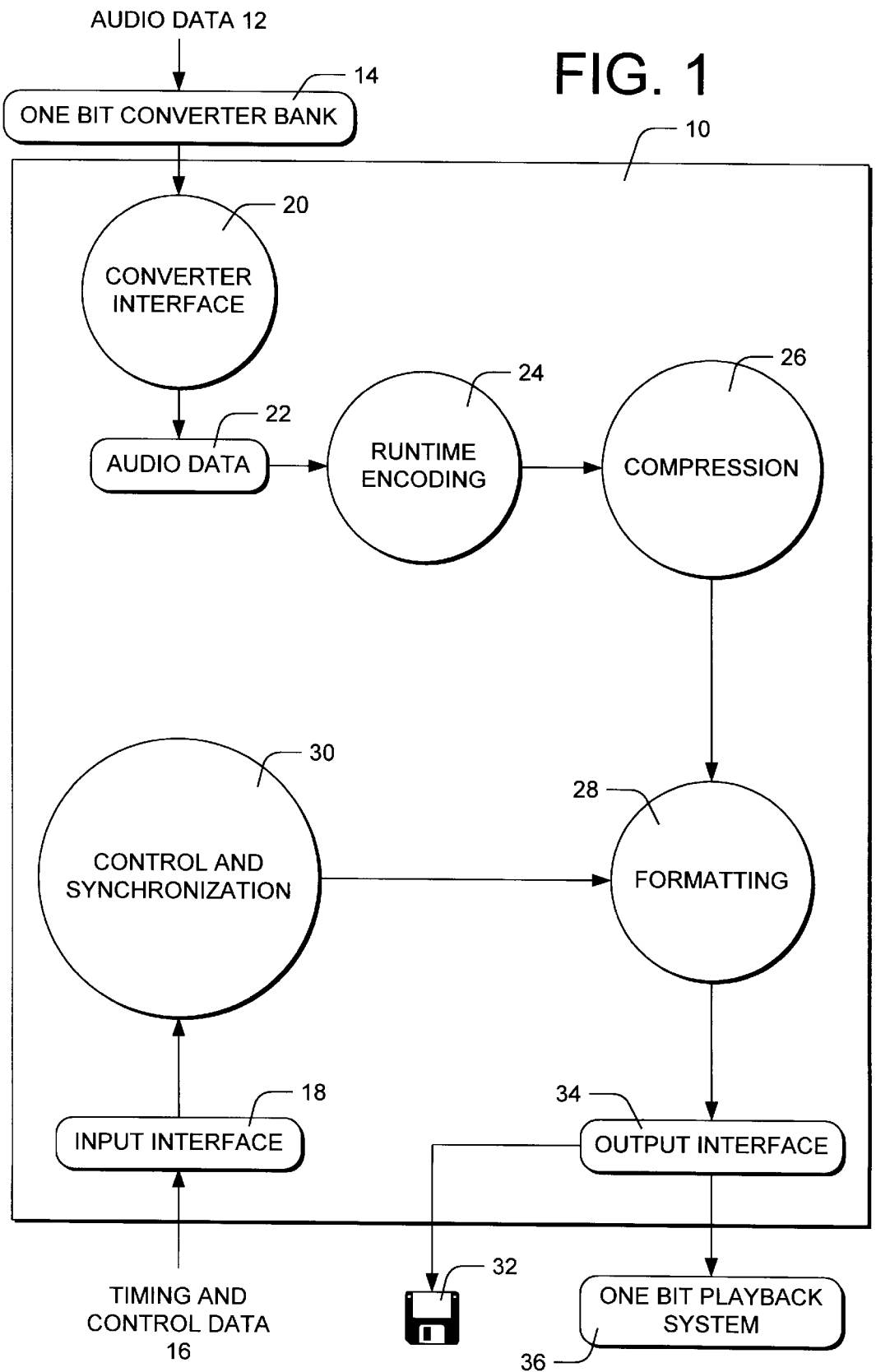
FIG. 1 is a block diagram illustrating the one-bit run-length encoder system according to the present invention.

FIG. 1 is a block diagram illustrating the one-bit run-length encoding system 10 according to the present invention. Preferably, the one-bit run-length encoding system 10 is implemented using a computer, wherein the computer is comprised of one or more processors, random access memory (RAM), and/or other components such as data storage devices and communication interfaces, as required. Of course, those skilled in the art will recognize that the illustration of FIG. 1 is not intended to limit the present invention. Indeed, those skilled in the art will recognize that other alternative embodiments may be used without departing from the scope of the present invention.

The one-bit run-length encoding system 10 operates under the control of an operating system, such as the Windows™, Macintosh™ or UNIX™ operating systems. In addition, the system 10 executes one or more computer programs to accomplish the present invention. Generally, the operating system and the computer programs, as well as any data associated therewith, are tangibly embodied in a computer-accessible media, carrier, or device. The operating system and the computer programs are loaded from the computer-accessible media, carrier, or device into the memory of the computer for execution. The operating system and the computer programs comprise instructions which, when read and executed by the computer, causes the computer to perform the necessary steps or elements of the present invention.

The one-bit run-length encoding system 10 accepts both analog and/or digital audio data 12, such as analog audio, AES/EBU (Audio Engineering Society/European Broadcasting Union) formatted digital audio, or any formatted pulse code modulated (PCM) audio data with an embedded clock signal. The analog and/or digital audio data 12 is received from, for example, a video disk, VHS tape, CD-ROM or other optical disk drive, magnetic disk drive, game cartridge, or other device. Generally it is assumed that the audio data 12 is received from devices outputting previously recorded timeline programs, devices outputting live events such as those received by a broadcast or live on set, or device outputting previously recorded event-trigger programs. Generally, the analog and/or digital audio data 12 is input to the one-bit converter bank 14, while associated timing and control data 16 is input to an input interface 18.

The audio data input from the one-bit converter bank 14 is read by a converter interface process 20. The audio data nominally arrives at the one-bit encoding system 10 in realtime, and thus the converter interface process 20 must be able to store a large amount of audio data with a sufficient sustain rate to handle such input and with a sufficient adequate burst rate to supply the other process of the one-bit run-length encoding system 10. The converter interface process 20 includes a FIFO or elastic buffer 22 along with suitable logic to process the audio data for use by a run-length encoding process 24 and a compression process 26. The converter interface process 20 concatenates or inter-leaves multi-channel audio data into a bitstream that satisfies the condition that there is a never a block of contiguous bits of identical value (0 or 1) containing more than 7 bits. This may be accomplished by any suitable method such as noise addition and shaping.

The audio data 22 is then read by a run-length encoding process 24. The run-length encoding process 24 merely determines how long the bits in the audio data are high or low, i.e., the number of consecutive identical bits. The run-length encoding process 24 samples at a rate twice as fast as the smallest possible pulse to meet the Nyquist criteria and generates run-length data as output.

The run-length data is a series of binary values indicating the run-lengths for the audio data. These binary values are preferably encoded into a 8-bit byte, wherein each byte represents a run-length encoding sample, i.e., five time periods high, six time periods low, twelve time periods high, etc. The 8-bit bytes are formatted in a manner where the leading bit indicates whether the value is high or low and the remaining seven bits indicate the number of sample periods that the signal corresponds to the indicated high or low value, i.e., up to 128 sample periods.

The run-length data output from the run-length encoding process 24 is transmitted to a compression process 26. Those skilled in the art will recognize that the compression process 26 could use any one of a number of different data compression techniques. The compression process 26 compresses the runlength data in a manner well known in the art so as to reduce throughput or distribution requirements.

The compressed data output from the compression process 26 is transmitted to a formatting process 28, which also accepts input from a control and synchronization process 30. The control and synchronization process 30 accepts timing and control data 16 via an input interface 18, wherein the timing and control data 16 may comprise any number of different formats such as SMPTE, MIDI, or other public or proprietary formats. The control and synchronization process 30 uses this information to generate clock signals and other information which are used to synchronize events in the audio data.

Using the clock signals and other information, the control and synchronization process 30 provides the elapsed time (position) and event markers to the formatting process 28 for insertion into the compressed audio data output by the compression process 26. The formatting process 28 performs this insertion so that the data may be correctly located upon playback. The markers, which vary in number with the number of triggered events desired, can be of any length required. Each marker is positioned in the compressed data using calculations derived from the compression method, so that it appears in its proper position in an uncompressed data stream at the one-bit run-length playback system. The resulting compressed audio data with embedded control data may be further compressed using any lossless compression technique.

After being time aligned by the formatting process 28, the compressed data is stored by the formatting process 28 in a storage media 32 or otherwise output via an output interface 34 to a one-bit run-length playback system 36. The output from the formatting process 28 is 16-bit words, wherein the first byte is a synchronizing byte and the second byte comprises a compressed run-length data byte. The output of the formatting process 28 may optionally be encrypted for data security.

One-Bit Converter Bank

Figure 2:
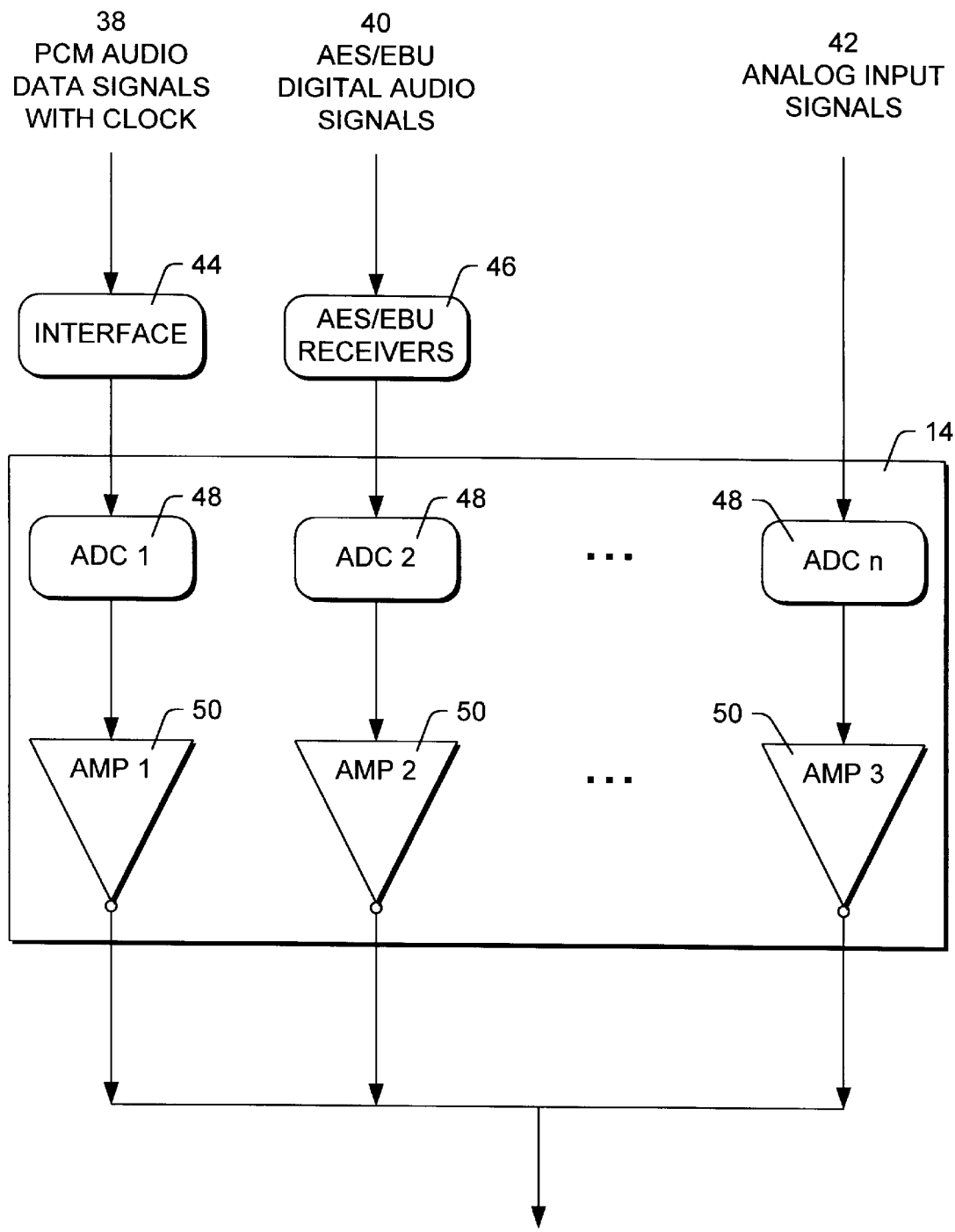
FIG. 2 is a block diagram illustrating the one-bit converter bank according to the present invention.

FIG. 2 is a block diagram further illustrating the components of the one-bit converter bank 14 according to the present invention The one-bit converter bank 14 may receive audio data from a number of different inputs, e.g., as pulse code modulated (PCM) audio data 38, as AES/EBU digital audio signals 40, and as analog input signals 42. The PCM audio data 38 incorporates clocking information and is received at a general hardware interface 44. AES/EBU digital audio 40 inputs are received at any number of AES/EBU receivers 46. The output from the interface 44, receivers 46, as well as the analog input signals 42, are converted into 16-bit PCM data by a plurality of analog-to-digital converters (ADCs) 48. This 16-bit PCM data is then amplified by amplifiers 50 and output by the one-bit converter bank 14 to the one-bit run-length encoding system 10.

The one-bit converter bank is preferably one or more 3 MHz analog-to-digital converters (ADCs) 48 and associated amplifiers 50 capable of accepting eight analog signals in parallel and generating an 8-bit digital word in parallel. The one-bit converter bank 14 receives the PCM data stream and converts it, using delta modulation, into a pulse density modulated bit stream which resembles, for example, the output of CD players. The data stream is termed a one-bit signal because it has only two levels, i.e., one or zero. The one-bit converter bank 14 outputs the converted data stream, which is transmitted to the one-bit run-length encoding system 10.

One-Bit Run-Length Playback System

Figure 3:
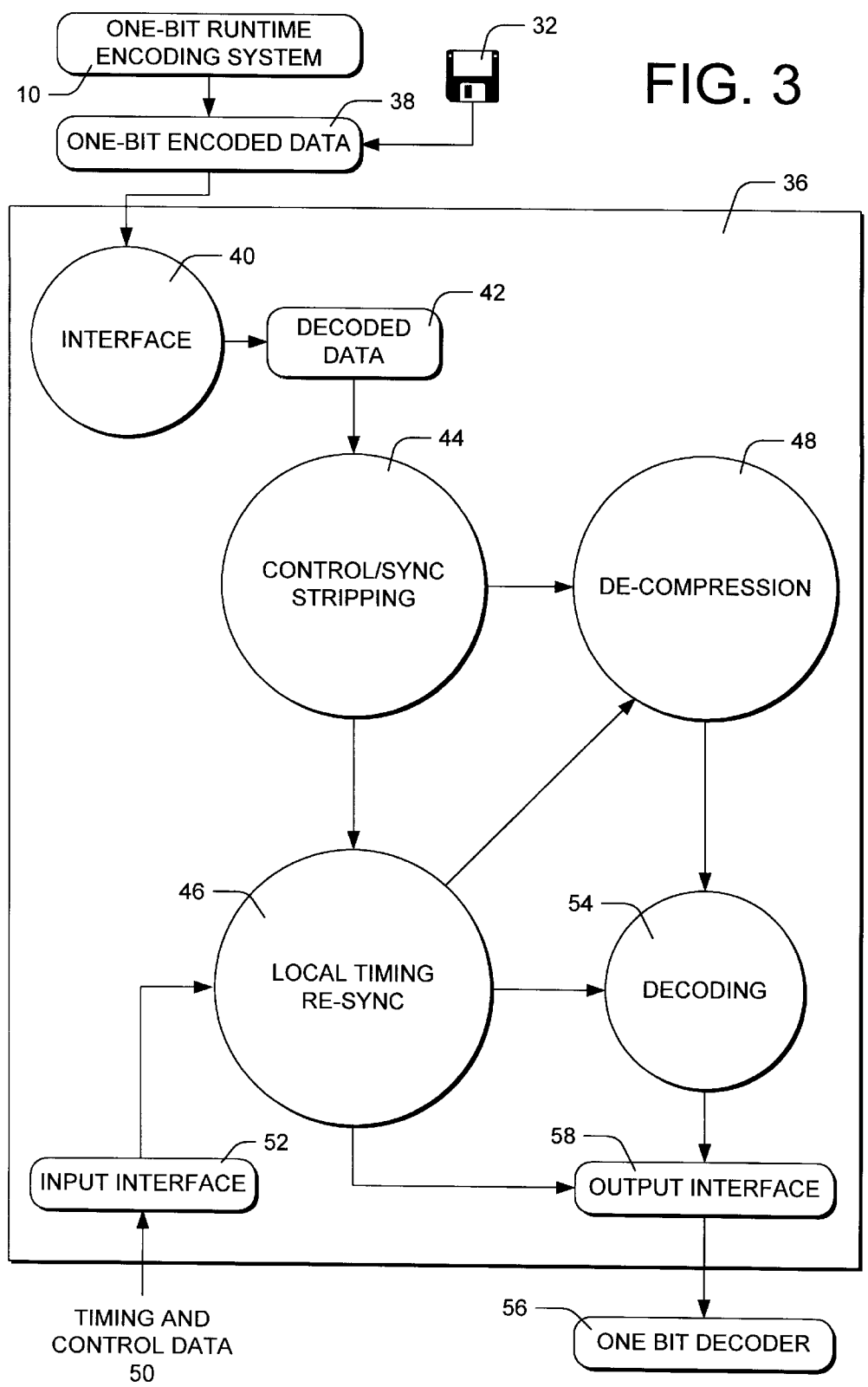
FIG. 3 is a block diagram illustrating the one-bit run-length playback system according to the present invention.

FIG. 3 is a one-bit run-length playback system 36 according to the present invention. Preferably, the one-bit run-length playback system 36 is implemented using a computer, wherein the computer is comprised of one or more processors, random access memory (RAM), and/or other components such as data storage devices and communication interfaces, as required. Of course, those skilled in the art will recognize that the illustration of FIG. 3 is not intended to limit the present invention. Indeed, those skilled in the art will recognize that other alternative embodiments may be used without departing from the scope of the present invention.

The one-bit run-length playback system 36 operates under the control of an operating system, such as the Windows™, Macintosh™ or UNIX™ operating systems. In addition, the system 36 executes one or more computer programs to accomplish the present invention. Generally, the operating system and the computer programs, as well as any data associated therewith, are tangibly embodied in a computer-accessible media, carrier, or device. The operating system and the computer programs are loaded from the computer-readable media, carrier, or device into the memory of the computer for execution. The operating system and the computer programs comprise instructions which, when read and executed by the computer, causes the computer to perform the necessary steps or elements of the present invention.

The one-bit run-length playback system 36 receives one-bit run-length encoded data 38 directly from the one-bit run-length encoding system 10 or indirectly via portable storage media 32 or some other computer-accessible carrier, device, or transmission method. An interface process 40 temporarily stores the one-bit run-length encoded data in a buffer 42.

The one-bit run-length encoded data stored in the buffer 42 is then transmitted to a control/sync stripping process 44 prior to decompression. There is a timeline, comprising labeled markers or tokens that uniquely denotes absolute or relative elapsed audio program time, embedded in the one-bit run-length encoded data. This timeline must be removed from the one-bit run-length encoded data by the control/sync process 44 prior to decompression.

The one-bit run-length encoded data is compressed by as much as 12:1 in the encoding system 100. This fact makes the use of lossy compression mandatory with current compression technology. If the event markers and clock (if present) have been compressed along with the audio data, there would be few practical methods of ensuring that these markers would retain either their numerical values or their positions in the data. Therefore, the markers are added to the audio data after compression and must be stripped out before decompression. The markers are passed, along with the locally generated timing information, to the local timing resync process 46 for mutual comparison and adjustment in time.

The decompression process 48 performs the inverse function of the compression process 26 found in the one-bit run-length encoding system 10. The decompression process 48 produces a reproduction or approximation (depending on the amount of information discarded by the chosen compression technique) of the one-bit run-length encoded form of the multichannel audio data. The compression and decompression steps must be asymmetric in time; at all events, the decompression process 48 must perform its function within a period of time appropriate to individual system requirements. Generally, near realtime performance is desired.

The decompression process 48 reconstructs the one-bit run-length encoded data through expansion of the compressed version thereof. It also parses the one-bit run-length encoded data to remove event markers (if any); this information is provided by the local timing re-sync process 46, which additionally provides a stable time based required for audio reproduction.

The decompressed one-bit run-length encoded data output from the decompression process 48 is transmitted to a decoding process 54, which also accepts clock signals and other information from the local timing re-sync process 46. The local timing re-sync process 46 receives timing and control data 50 via an input interface 52, wherein the timing and control data 50 may comprise any number of different formats such as SMPTE, MIDI, or other public or proprietary formats. Using the clock signals and other information, the decoding process 54 generates and transmits the one-bit run-length encoded data to the one-bit decoder 56 via the output interface 58.

One-Bit Decoder

Figure 4:
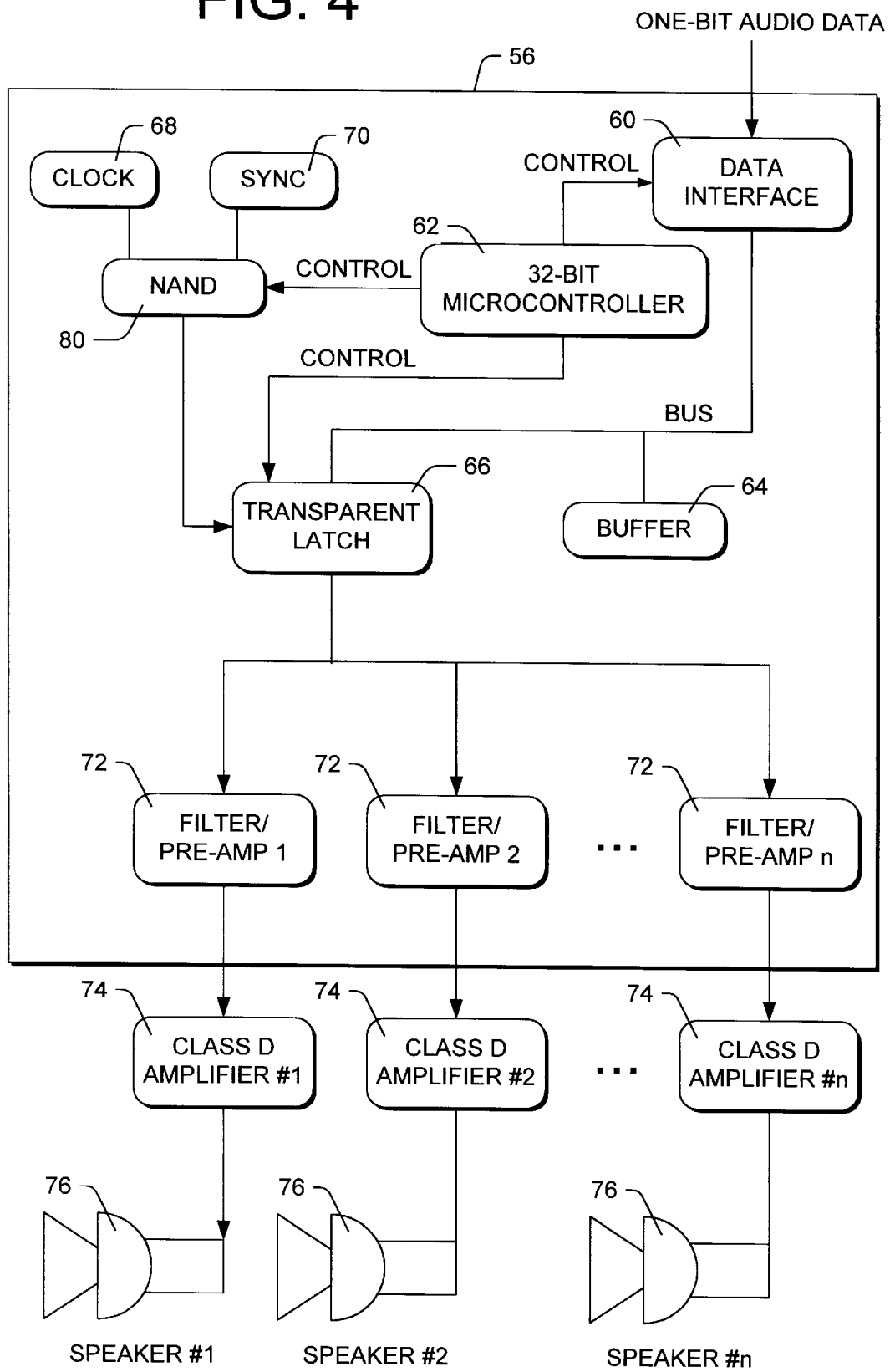
FIG. 4 is a block diagram illustrating the one-bit decoder according to the present invention.

FIG. 4 is a block diagram that illustrates the components of a one-bit decoder 56 according to the present invention. The one-bit run-length encoded data is received by the decoder 56 at a data interface 60 that is controlled by a 32-bit microcontroller 62. So, for example, each 32-bit data word read from the data interface 60 may comprise the values representing five high, two low, three high, two low, etc., coded in the 4-bit nibbles of 8-bit bytes making up the 32-bit word.

Each 32-bit word received by the data interface 60 is stored into a buffer 64 and represents the audio signals for 32 channels. The data is stored in the buffer in an uncompressed bit stream format that represents the pulse code modulated (PCM) audio data stream originally input into the one-bit run-length encoding system 10. The data is clocked out of the buffer into a transparent latch 66 bit-wise by channel, so that bit 0 is channel 1 and bit 31 is channel 32. The data is clocked out of the transparent latch at a rate that reconstructs the original input to the one-bit run-length encoding system 10. The transparent latch 66 is controlled by a clock signal 68 and a synchronous signal 70 that are NANDed together at 80 and controlled by the 32-bit microcontroller 62. Under control of the NANDed signals at 80, each bit is output from the transparent latch 66 and transmitted through a plurality of low-pass filters and pre-amps 72 that perform digital to analog conversion.

While the pulse-width modulation signal can be converted from digital to analog by standard methods, it may often be preferable to use Class D amplifiers 74 to drive speakers 76. In order to remove high frequency artifacts, the Class D amplifiers 74 require a low pass filter at their outputs. If these filters are passive, they may be instantiated as one or more tapped filters at the transducers. Thus, a certain amount of electrical and acoustical mixing is possible. The advantages to this method is that the signal may be distributed by a coaxial cable from a central point, wherein matching networks at each end of the transmission line ensure that the signals will not smear or that they will smear in a predictable manner. Another advantage to this method is the ability to combine filtering and mixing functions, which decreases parts count and costs.

The topology of the Class D amplifier 74 uses source and sink output stages that consist of full-on or full-off switches. These output stages toggle from full sink to full source at a rate significantly higher than the highest audio frequency to be reproduced. The ratio of time sinking to time sourcing controls the audio output with a 50% ratio delivering zero output. An advantage is that the Class D amplifier 74 offers significantly higher efficiency than even Class B amplifiers, which at ⅓ power is wasting more power inside the amplifier than it delivers to the load. Losses in Class D amplifier 74 designs are limited to turn on time of the switching devices and resist of losses in these devices and output filtering. On the other, Class D amplifiers 74 require more complex circuit designs with extensive shielding and filtering.

Conclusion

This concludes the description of the preferred embodiment of the invention. The foregoing description of the preferred embodiment has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An audio recording system, comprising:
   a one-bit converter for generating a plurality of channels of digital audio data from one or more external sources;
   means for interleaving the plurality of channels into a run-length data stream, wherein the run-length data stream comprises a series of binary values indicating run-length lengths for each of the channels of digital audio data; and
   an input interface for accepting timing and control data associated with the audio data;
   means for inserting control and synchronization markers derived from the timing and control data into the run-length data stream, so that the digital audio data may be correctly located upon playback.

2. The audio recording system of claim 1, further comprising means for compressing the run-length data stream.

3. The audio recording system of claim 1, further comprising means for encrypting the run-length data stream.

4. The audio recording system of claim 1, further comprising means for storing the run-length data stream on a data storage device.

5. The audio recording system of claim 1, further comprising means for transmitting the run-length data stream.

6. The audio recording system of claim 1, wherein the one-bit converter accepts both analog and digital signals and generates the digital audio data therefrom.

7. The audio recording system of claim 1, wherein the one-bit converter generates pulse density modulated digital audio data.

8. The audio recording system of claim 1, wherein the digital audio data has only two levels comprising a logical one and a logical zero.

9. The audio recording system of claim 1, wherein the run-length data stream comprises a synchronizing portion and the run-length data portion.

10. An audio playback system, comprising:
    means for receiving a plurality of channels of digital audio data interleaved into a run-length data stream, wherein the run-length data stream comprises a series of binary values indicating run-length lengths for each of the channels of digital audio data;
    means for removing control and synchronization markers from the run-length data stream and for using the removed control and synchronization markers to control the playback of the run-length data stream;
    means for reconstructing the plurality of channels of digital audio data interleaved into the run-length data stream; and
    means for transmitting the reconstructed plurality of channels of digital audio data to an one-bit decoder, wherein the one-bit decoder recreates analog signals from the digital audio data to drive a plurality of audio transducers.

11. The audio recording system of claim 10, further comprising means for de-compressing the run-length data stream.

12. The audio recording system of claim 10, further comprising means for de-encrypting the run-length data stream.

13. The audio recording system of claim 10, further comprising means for retrieving the run-length data stream from a data storage device.

14. The audio recording system of claim 10, further comprising means for receiving the run-length data stream from a transmitting device.

15. The audio recording system of claim 10, wherein the run-length data stream comprises a synchronizing portion and the run-length data portion.

16. The audio recording system of claim 15, wherein the synchronizing portion comprises inserted control and synchronization markers that a timeline for an audio program embedded in the run-length data stream.

* * * * *